(12) United States Patent
Chilappagari et al.

(10) Patent No.: US 8,531,888 B2
(45) Date of Patent: Sep. 10, 2013

(54) DETERMINING OPTIMAL REFERENCE VOLTAGES FOR PROGRESSIVE READS IN FLASH MEMORY SYSTEMS

(75) Inventors: Shashi Kiran Chilappagari, San Jose, CA (US); Xueshi Yang, Cupertino, CA (US)

(73) Assignee: Marvell World Trade Ltd., St. Michael (BB)

( * ) Notice: Subject to any disclaimer, the term of this patent is extended or adjusted under 35 U.S.C. 154(b) by 166 days.

(21) Appl. No.: 13/167,896

(22) Filed: Jun. 24, 2011

(65) Prior Publication Data

US 2012/0008386 A1    Jan. 12, 2012

Related U.S. Application Data

(60) Provisional application No. 61/362,253, filed on Jul. 7, 2010.

(51) Int. Cl.
*G11C 11/34* (2006.01)

(52) U.S. Cl.
USPC .............. 365/185.2; 365/185.03; 365/185.05; 365/185.18; 365/185.19; 365/185.21; 365/185.24; 365/189.011; 365/189.15

(58) Field of Classification Search
USPC ............ 365/185.03, 185.05, 185.18, 185.19, 365/185.2, 185.21, 185.24, 189.011, 189.15
See application file for complete search history.

(56) References Cited

U.S. PATENT DOCUMENTS 7,848,152 B1 * 12/2010 Huang et al. ............. 365/185.24
2010/0329004 A1 * 12/2010 Hemink ................... 365/185.03

* cited by examiner

*Primary Examiner* — Fernando Hidalgo

(57) ABSTRACT

A system including a reference voltage module to select a first reference voltage between a first threshold voltage corresponding to a first state of a memory cell and a second threshold voltage corresponding to a second state of the memory cell, a second reference voltage less than the first reference voltage, and a third reference voltage greater than the first reference voltage. The system includes a read module to perform a first read operation to determine a state of the memory cell based on the first reference voltage, and in response to a first failure to decode data read from the memory cell in the first read operation, perform a second read operation to determine the state based on the second reference voltage and a third read operation to determine the state based on the third reference voltage.

20 Claims, 9 Drawing Sheets

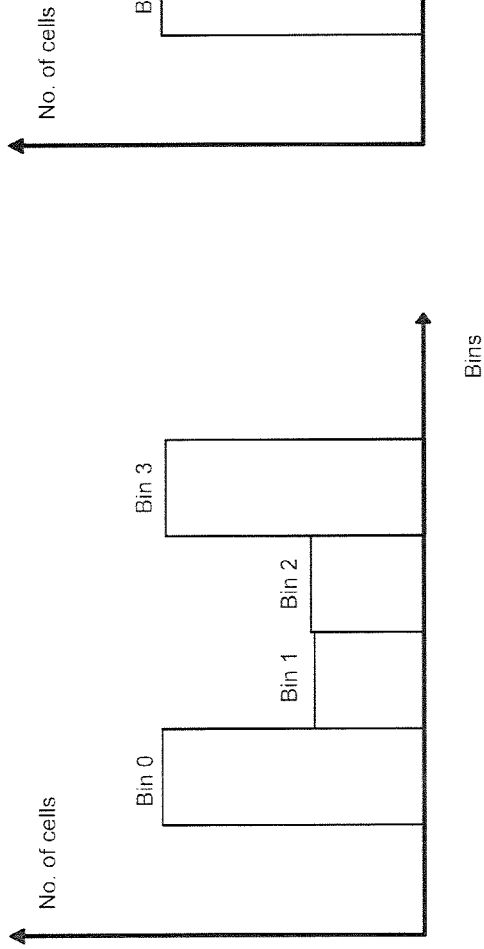
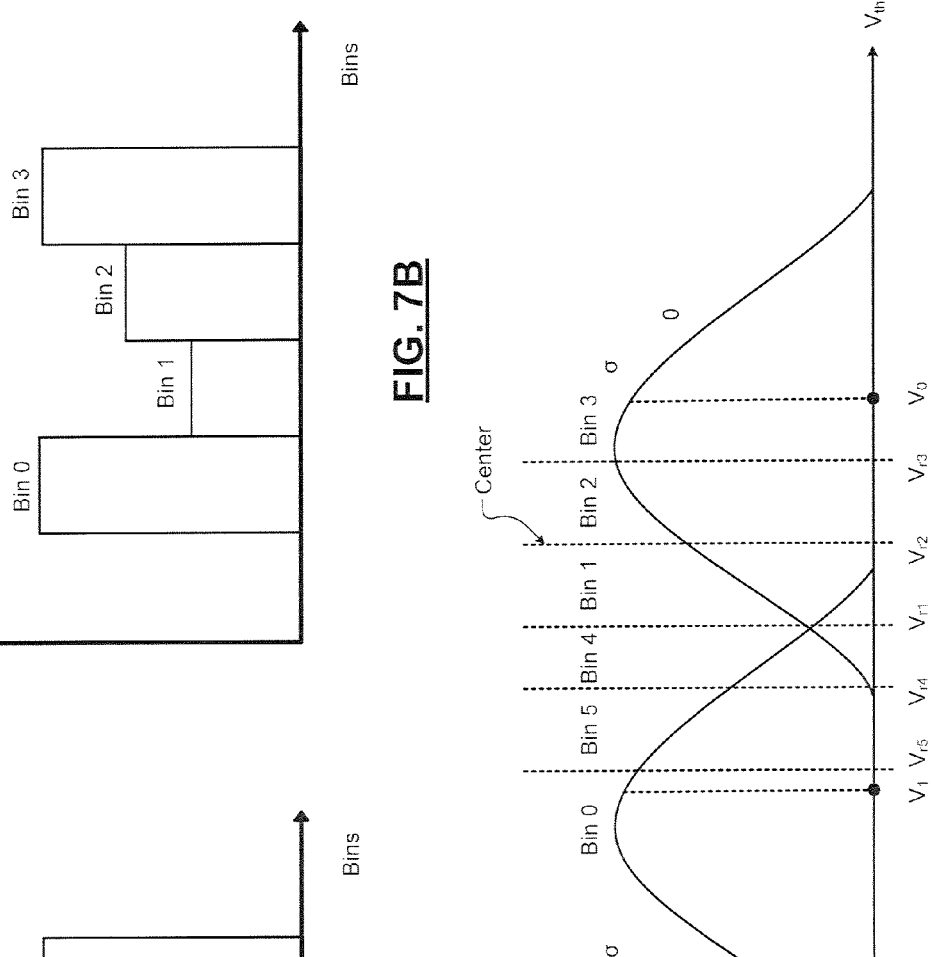

DETERMINING OPTIMAL REFERENCE VOLTAGES FOR PROGRESSIVE READS IN FLASH MEMORY SYSTEMS

CROSS-REFERENCE TO RELATED APPLICATIONS

This application claims the benefit of U.S. Provisional Application No. 61/362,253 filed Jul. 7, 2010. The disclosure of the above application is incorporated herein by reference in its entirety.

FIELD

The present disclosure relates to semiconductor memory systems and more particularly to determining optimal reference voltages for progressive reads in flash memory systems.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Memory integrated circuits (ICs) comprise memory arrays. The memory arrays include memory cells arranged in rows and columns. The memory cells ma include cells of volatile or nonvolatile memory. Volatile memory loses data stored in the memory cells when power is removed from the memory cells. Nonvolatile memory retains data stored in the memory cells when power is removed from the memory cells.

The memory cells in the rows and columns of a memory array are addressed by word lines (WLs) that select the rows and bit lines (BLs) that select the columns. The memory ICs comprise WL and BL decoders that select the WLs and BLs, respectively during read/write (R/W) and erase; program (EP) operations.

Referring now to FIG. 1, a memory IC 10 comprises a memory array 12, a WL decoder 16, a BL decoder 18, and a control module 19. The memory array 12 comprises memory cells 14 arranged in rows and columns as shown. The WL and BL decoders 16, 18 select the WLs and BLs, respectively, depending on the addresses of the memory cells 14 selected during R/W and EP operations.

The control module 19 receives commands (e.g. read, write, erase, program etc.) from a host (not shown). The control module 19 reads and writes data in the selected memory cells 14. Additionally, the control module 19 erases and programs the selected memory cells 14 (e.g. in one or more blocks or pages) when the memory cells 14 include cells of nonvolatile memory such as flash memory.

For example only, the memory cells 14 may include cells of NAND or NOR flash memory. Each memory cell 14 may be programmed to store N binary digits (bits) of information where N is an integer greater than or equal to 1. Accordingly, each memory cell 14 may have $2^N$ states. To store N bits per cell, each memory cell 14 may comprise a transistor having $2^N$ programmable threshold voltages (hereinafter threshold voltages). The $2^N$ threshold voltages of the transistor represent the $2^N$ states of the memory cell 14, respectively.

Referring now to FIG. 2, a memory cell 14-$i$ may comprise a transistor 50 having a threshold voltage $V_T$. The transistor 50 may comprise a floating gate G (hereinafter gate G), a source S, and a drain D. The amount of charge stored in the gate G during a write operation determines the value of threshold voltage $V_T$ and the state of the memory cell 14-$i$.

For example only, the transistor 50 may have two programmable threshold voltages $V_{T1}$ and $V_{T2}$ depending on the amount of charge stored in the gate G. When the amount of charge stored in the gate G is Q1, the threshold voltage of the transistor 50 is $V_{T1}$. When the amount of charge stored in the gate G is Q2, the threshold voltage of the transistor 50 is $V_{T2}$. Depending on the amount charge stored in the gate G, a gate voltage (i.e. $V_{GS}$) having a value greater than or equal to $V_{T1}$ or $V_{T2}$, may turn on the transistor 50 (i.e. generate a predetermined drain current).

The state of the memory cell 14 (i.e. data stored in the memory cell 14) is read by measuring the threshold voltage $V_T$ of the transistor 50. The threshold voltage $V_T$ cannot be read out directly. Instead, the threshold voltage $V_T$ is measured by applying the gate voltage to the gate G and sensing the drain current. The drain current is sensed by applying a small voltage across the source S and the drain D of the transistor 50.

When the gate voltage is less than the threshold voltage $V_T$, the transistor 50 is off, and the drain current is low (approximately zero). Conversely, when the gate voltage is greater than or equal to the threshold voltage $V_T$, the transistor 50 turns on, and the drain current becomes high (i.e. equal to the predetermined drain current corresponding to the $V_T$). The value of the gate voltage that generates the high drain current represents the threshold voltage $V_T$ of the transistor 50.

Typically, states of memory cells in a block or a page of a memory array are sensed at a time. The gates of the transistors of the memos cells in the block are connected to a WL. The WL is selected, and a voltage is applied to the WL. The states of N-bit memory cells are sensed by stepping through $(2^N-1)$ voltages on the WL and determining the threshold voltages of the transistors when the drain currents of the transistors first exceed a predetermined (preprogrammed) value.

Referring now to FIGS. 3A and 3B, the threshold voltage of the transistor 50 is measured as follows. For example only, the transistor 50 may have one of four threshold voltages $V_{T1}$ to $V_{T4}$, where $V_{T1}<V_{T2}<V_{T3}<V_{T4}$. Accordingly, the memos cell 14-$i$ may have one of four states 00, 01, 10, and 11.

In FIG. 3A, the control module 19 comprises a voltage generator 20 and current sensing amplifiers 22. The number of current sensing amplifiers is equal to the number of BLs. For example, when the IC 10 comprises B BLs the current sensing amplifiers 22 include B current sensing amplifiers for B BLs, respectively, where B is an integer greater than 1.

In FIG. 3B, the WL decoder 16 selects a WL comprising memory cells 14-1. 14-2, ..., 14-$i$, ..., and 14-$n$ (collectively memory cells 14) when the states of the cells are to be determined. Each of the memo cells 14 includes a transistor similar to the transistor 50. The transistors are shown as capacitances C that store the charge in the gates.

When a read operation begins, the voltage generator 20 supplies a voltage (e.g. a staircase voltage) to the WL decoder 16. The WL decoder 16 inputs the voltage to the selected WL. Accordingly, the voltage is applied to the gates of the transistors on the selected WL.

The current sensing amplifiers 22 include one current sensing amplifier for each BL. For example, a current sensing amplifier 22-$i$ communicates with a bit line BL-$i$ and senses the drain current that flows through the transistor 50 of the memory cell 14-$i$. The current sensing amplifier 22-$i$ senses the drain current applying a small voltage across the source and the drain of the transistor 50.

Each current sensing amplifier senses the drain current through the respective one of the transistors of the memory cells 14. The control module 19 measures the threshold voltages of the transistors based on the drain currents sensed by the respective current sensing amplifiers 22.

SUMMARY

A system including a reference voltage module to select (i) a first reference voltage between a first threshold voltage corresponding to a first state of a memory cell and a second threshold voltage corresponding to a second state of the memory cell, (ii) a second reference voltage less than the first reference voltage, and (iii) a third reference voltage greater than the first reference voltage. The system includes a read module to perform a first read operation to determine a state of the memory cell based on the first reference voltage, and in response to a first failure to decode data read from the memory cell in the first read operation, perform (i) a second read operation to determine the state based on the second reference voltage and (ii) a third read operation to determine the state based on the third reference voltage.

In another feature, the system further includes a shift detection module to detect, in response to a second failure to decode data read from the memory cell in the first, second, and third read operations, a shift in a distribution of at least one of the first threshold voltage and the second threshold voltage, and to determine an amount of the shift.

In other features, the system further includes a binning module to divide the distribution of the first and second threshold voltages into four bins based on the first, second, and third reference voltages, and a log-likelihood ratio module to generate log-likelihood ratios for the four bins based on a variance of the distribution.

In other features, the system further includes a voltage selection module configured to select a first voltage adjacent to the first threshold voltage, a voltage incrementing module configured to increment the first voltage by a predetermined amount until the first voltage increases to a midpoint of the first and second threshold voltages and a parameter generation module configured to generate a parameter for each incremented value of the first voltage. The parameter for an incremented value of the first voltage indicates a statistical certainty regarding an actual state of the memory cell. The reference voltage module selects one of the incremented values of the first voltage having a highest value of the statistical certainty as the second reference voltage.

Further areas of applicability of the present disclosure will become apparent from the detailed description, the claims and the drawings. The detailed description and specific examples are intended for purposes of illustration only and are not intended to the scope of the disclosure.

BRIEF DESCRIPTION OF DRAWINGS

The present disclosure will become more fully understood from the detailed description and the accompanying drawings, wherein:

FIG. 7A is a histogram of bin counts when a center of the threshold voltage distribution has not shifted;

FIG. 7B is a histogram of in counts when a center of the threshold voltage distribution has shifted;

FIG. 7C depicts a threshold voltage distribution of a single-bit cell and an example of asymmetric selection of reference voltages when a center of the threshold voltage distribution has shifted;

DESCRIPTION

Figure 2:
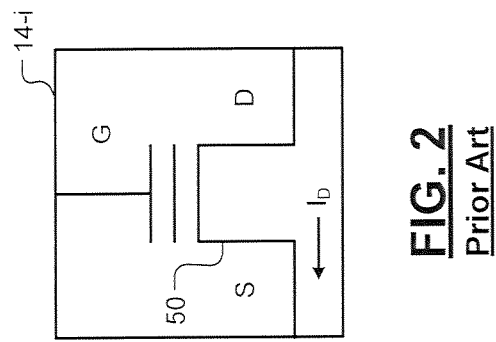
FIG. 2 is a schematic of a multi-level memory cell.
Figure 1:
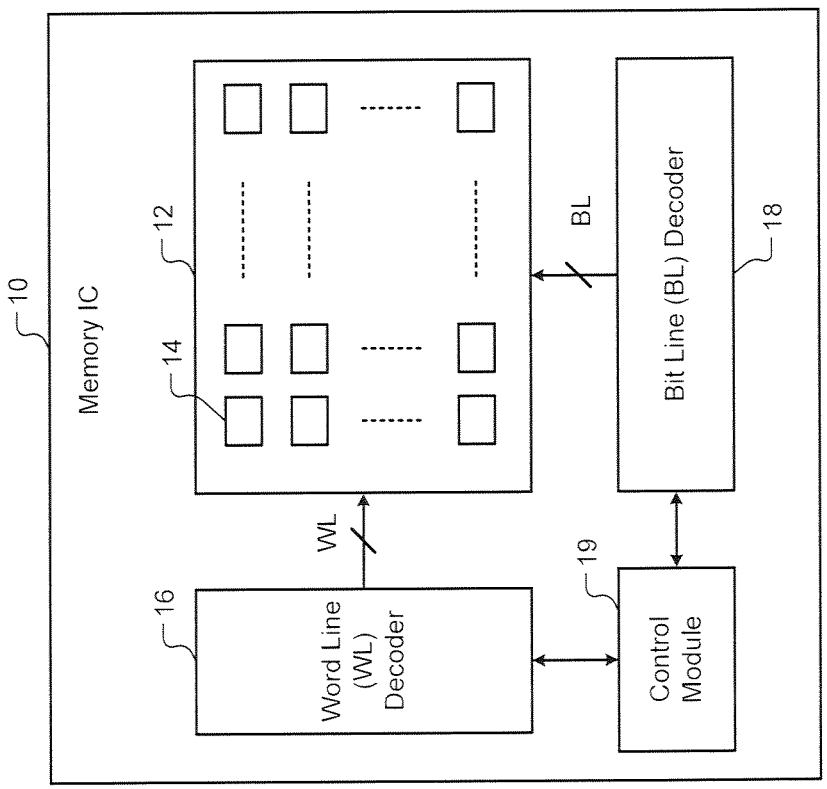
FIG. 1 is a functional block diagram of a memory integrated circuit (IC)

The following description is merely illustrative in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical OR. It should be understood that steps within a method may be executed in different order without altering the principles of the present disclosure.

As used herein, the term module may refer to be part of, or include an Application Specific Integrated Circuit (ASIC); an electronic circuit; a combinational logic circuit; a field programmable gate array (FPGA); a processor (shared, dedicated, or group) that executes code; other suitable components that provide the described functionality; or a combination of some or all of the above, such as in a system-on-chip. The term module may include memory (shared, dedicated, or group) that stores code executed by the processor.

The term code, as used above, may include software, firmware, and/or microcode and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors. In addition, some or all code from a single module may be stored using a group of memories.

The apparatuses and methods described herein may be implemented by one or more computer programs executed by one or ore processors. The computer programs include processor-executable instructions that are stored on a non-transitory tangible computer readable medium. The computer programs may also include stored data. Non-limiting examples of the non-transitory tangible computer readable medium are nonvolatile memory magnetic storage, and optical storage.

States of nonvolatile memory cells that store data by storing different amounts of charge can be sensed by measuring threshold voltages of the memory cells. The threshold voltages cannot be read out directly however. Rather, the threshold voltages determined by applying a voltage, measuring a drain current, and comparing the applied voltage to predetermined reference voltages. Typically, a single read operation is performed using only one reference voltage to determine a threshold voltage of a memory cell. When errors occur, however, multiple read operations (reads) may have to be performed to correctly determine the threshold voltage of the memo cell.

The present disclosure relates to systems and methods for determining, optimal reference voltages for performing, progressive reads. Specifically, one or more read operations may be performed using, one or more reference voltages to determine a threshold voltage of a memory cell. More than one read operation is performed if a single read operation cannot of correctly determine the threshold voltage. The reference voltages are calculated statistically as explained below. The number of read operations may be increased progressively if errors persist. In progressive reads, when the number of read operations is increased, all the reference voltages are not determined anew. Rather, reference voltages from previous reads are retained, and only the additional reference voltages are calculated anew. Additionally, before increasing the number of read operations, the existing reference voltages may be adjusted to compensate for drift in the threshold voltage distributions, and the existing number of reads may be retried. Also disclosed herein are other methods that may be used to compensate for the drift instead of adjusting the reference voltages.

In some memory systems such as flash memory systems, memory cells store data by trapping granulized amounts of charge in an isolated region of a transistor called a floating gate. Data stored in a memory cell (e.g., a transistor as explained below) is read by applying a voltage to the transistor and estimating the readout current which is determined by the amount of charge trapped. When the applied voltage is greater than or equal to the threshold voltage of the transistor, which is determined by the amount of charge trapped, the transistor turns on, and the readout current is high.

Memory cells may store one or more bits per cell and may be called single-level or multi-level memory cells, respectively. A single-level memory cell may store one bit of information. For example only, the bit may be logic 0 when charge is stored in the memory cell or logic 1 when no charge is stored in the memory cell.

The multi-level memory cells may store more than one bit of information by storing varying amounts of charge or charge levels. For example, suppose Q is the maximum amount of charge that can be trapped in a multi-level memory cell. More than one bit of information can be stored in such a memory cell by storing a granulized amount of charge between 0 and Q. For example only, two bits of information may be stored in one multi-level memory cell by trapping any one of four levels of charges; 0, Q/3, 2Q/3. Q.

The process of trapping charge is called programming. The various levels of trapped charges translate into different threshold voltages for the memory cell. The data stored in the memory cell can be read by estimating the amount of charge stored in the memory cell. The amount of charge stored in the memory cell is estimated by applying a voltage and reading the current. When the current becomes high, the applied voltage is compared to one of the reference voltages. The reference voltages correspond to various states and corresponding threshold voltages of the memory cell, which depend on the amount of charge trapped in the memory cell.

Figure 4A:
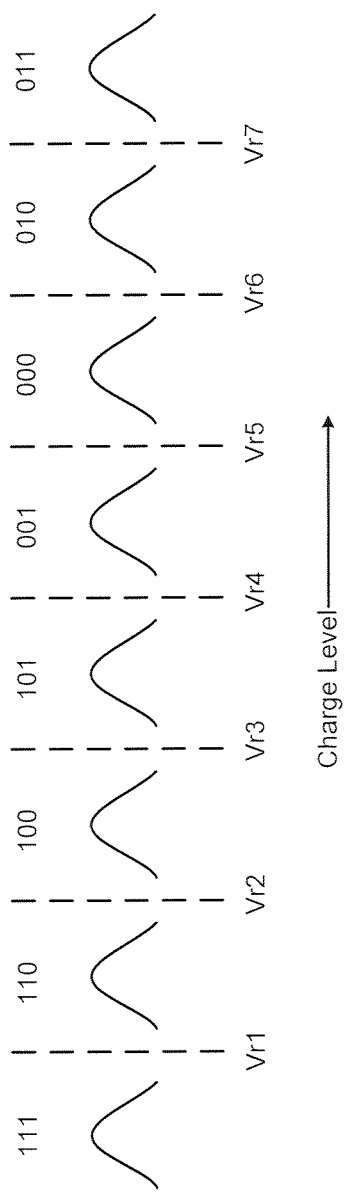
FIG. 4A depicts charge level distributions of a 3-bit memory cell.

Referring now to FIG. 4A, an example of a threshold voltage distribution for a 3-bit memory cell is shown. The 3-bit memos cell is used for example only. The discussion is applicable to a N-bit memory cell having $2^N$ nominal threshold voltages and ($2^N-1$) reference voltages, where N is an integer greater than 1.

The 3-bit memory cell can store up to eight different levels of charge, where each charge level corresponds to one of eight different states. Accordingly, the threshold voltage distribution of the memory cell includes eight different nominal threshold voltages. The eight nominal threshold voltages are associated with the eight levels of charge that can be stored in the memory cell, respectively. Although cells to be programmed to a desired state are programmed to a charge level corresponding to the desired state, the actual charge stored in the cell when the cell is programmed to the desired state can differ and results in a distribution of the threshold voltage around the nominal threshold voltage. Accordingly, threshold voltages can have a distribution instead of a single value.

Intersections of adjacent charge levels define reference voltages that may be used to detect the data stored in the memory cell during, read operations. According, the 3-bit memory cell has seven reference voltages ($V_{r1}$ through $V_{r7}$) that are located where adjacent distribution curves intersect.

The reference voltages should be known during a read operation to determine the level of charge and consequently the data stored in the memos cell. Initially, the reference voltages are set at the time of manufacture. Subsequently, during normal read operations, the threshold voltage of the memory cell is measured (by applying a voltage to the gate and measuring the drain current) and compared to the seven reference voltages to determine the data stored in the memory cell (i.e. the state of the memory cell).

For example only, when the threshold voltage is less than or equal to $V_{r1}$, the data stored in the memory cell is 111. When the threshold voltage is less than or equal to $V_{r2}$ and greater than $V_{r1}$, the data stored in the memory cell is 110, and so on. Finally, when the threshold voltage is greater than $V_{r7}$, the data stored in the memory cell is 011.

Figure 4B:
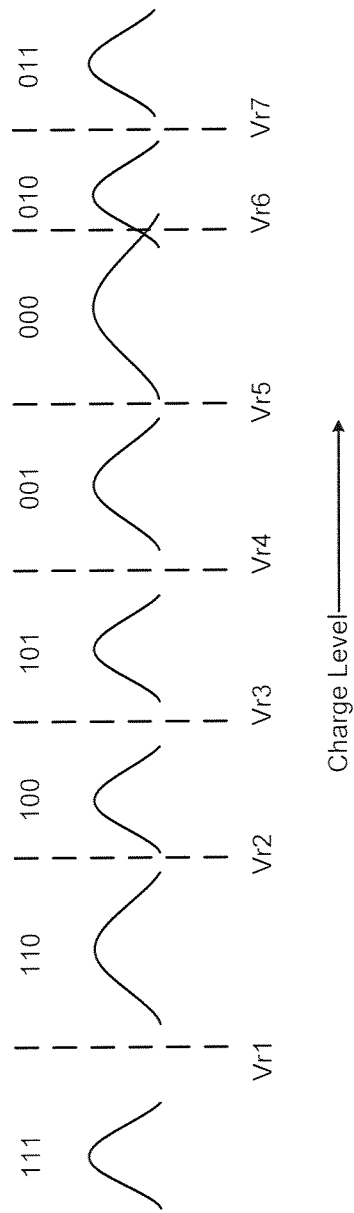
FIG. 4B depicts drifts in the level distributions of FIG. 4A due to cycling of the 3-bit memory cell.

Referring now to FIG. 4B, memory cells such as the multi-level flash memory cells may be subjected to charge retention loss after repeated read, write, erase, and/or program operations (collectively called cycling). For example, the oxide surrounding the floating gates of the memory cells may degenerate after repeated cycling. Consequently, the threshold voltage distributions may change or drift after cycling as shown. Accordingly, after cycling, data read using initial reference voltages from before cycling may be incorrect.

A read operation typically involves making a hard decision about the bits stored in memos cells. Consider a single-bit memory cell that can store either a 0 or a 1. Suppose the nominal threshold voltages corresponding to the stored values (i.e. states) 0 and 1 are $V_0$ and $V_1$, respectively. Without loss of generality, assume that $V_0 > V_1$. Since the single-bit memory cell can have two states 0 or 1, only one reference voltage $V_r$ set at the center of $V_0$ and $V_1$ is typically sufficient to detect the state of the single-bit memory cell.

The threshold voltages can vary over time due to usage and operating conditions (e.g. noise). If both the threshold voltages are subjected to similar noise conditions, the reference voltage $V_r$ can be set to the midpoint of $V_0$ and $V_1$ i.e. $V_r = 0.5*(V_0+V_1)$. It can be shown that this setting of $V_r$ is optimal from a bit error rate (BER) perspective. The threshold voltage of the cell (i.e. the voltage at which drain current is high) is compared to $V_r$. If the threshold voltage is greater than $V_r$, the cell is read as 0 and 1 otherwise. This is known as hard decision since the result of the read operation is a hard decision regarding the state of the memory cell.

Generally, memory cells in one block or one page are read at a time. That is, a voltage is applied to the memo cells in a page, and the cells are read as storing 0 or 1 depending on whether the threshold voltages of the cells are greater or less than the reference voltage. When noise levels are high or the threshold voltage distribution of the cells shifts due to usage, the hard decisions can be incorrect if the reference voltage is not adjusted to account for the noise or the shift. Error-correcting decoders may be used to correct some errors. Not all the errors, however, may be corrected.

Errors can be reduced by performing more reads instead performing a single read when determining a threshold voltage of a memory cell. Specifically, additional reads can be performed using additional reference voltages to determine the threshold voltage. By performing more reads, more information can be collected about the data stored in the cells. The additional information collected by performing the additional reads is called soft information, which can be used by the decoder to correct errors.

Figure 5:
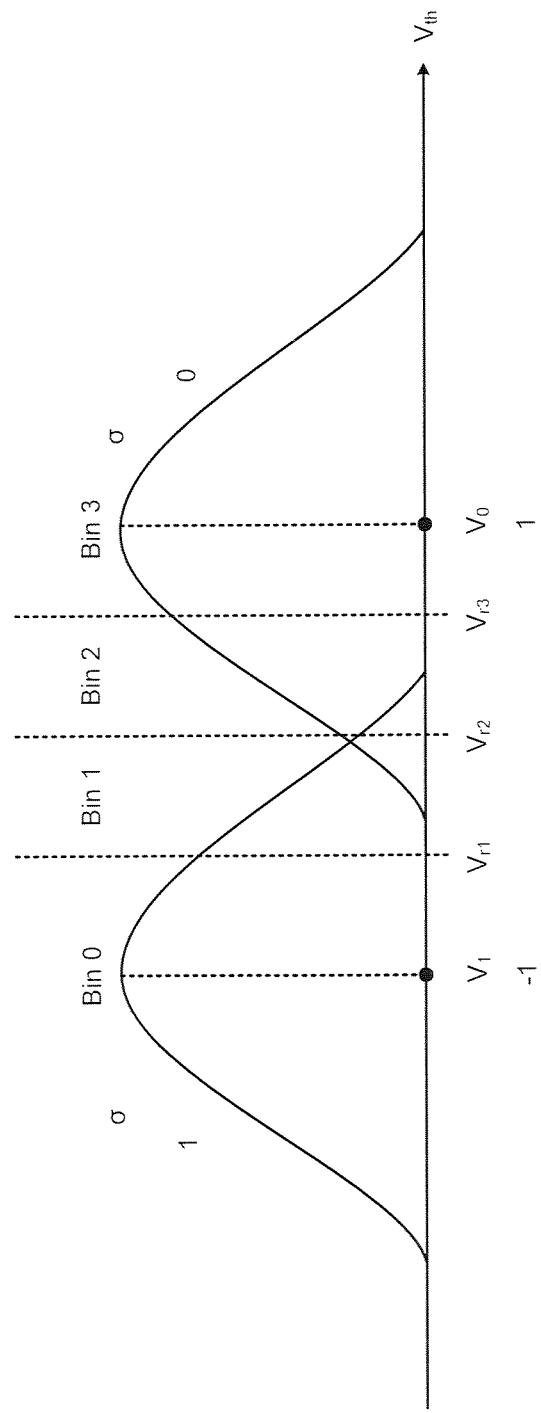
FIG. 5 depicts a threshold voltage distribution of a single-bit cell and reference voltages used to perform multiple read operations.

Referring to FIG. 5, for example, consider a threshold voltage distribution of a single-bit cell that can store a 1 or a 0. The nominal voltage levels corresponding to the two states of the cell are denoted as −1 and 1, respectively. For example only, −1 and 1 may correspond to 1V and 4V, respectively. That is, in FIG. 5, $V_1$ and $V_0$ may be equal to 1V and 4V, respectively.

Assume that three reference voltages $V_{r1} < V_{r2} < V_{r3}$ are used in three read operations to determine the threshold voltage of the cell. That is, the voltage applied to the cell is compared to the three reference voltages to determine the threshold voltage of the cell. The three reference voltages partition the real line comprising, the threshold voltage into four regions $R_1 = (-\infty, V_{r1}]$, $R_2 = (V_{r1}, V_{r2}]$, $R_3 = (V_{r2}, V_{r3}]$ and $R_4 = (V_{r3}, \infty)$. By performing three reads, the threshold voltage of the cell can be binned into one of the four regions or bins.

Cells having threshold voltages in bin 0 are more likely to have stored a −1 and cells having threshold voltages in bin 3 are snore likely to have stored a 1. Cells having threshold voltages in bin 1 and bin 2, however, could have stored a −1 or a 1. The uncertainty about the states of the cells in bins 1 and 2 can be reduced by further increasing the number of reads. That is, the threshold voltage of a cell can be determined more accurately by increasing the number of reads. However, for practical purposes, the number of reads should be kept finite.

The concept of soft information is now explained. Suppose a threshold voltage of a cell is in bin 0. The probability P that the state of the cell is 1 (i.e. X=1) given that the threshold voltage read (i.e. Y) lies in bin 0 (i.e. Y∈ bin 0) is expressed as P(X=1|Y ∈bin 0). Similarly, the probability P that the state of the cell is −1 (i.e. X=−1) given that the threshold voltage read (i.e. Y) lies in bin 0 (i.e. Y∈ bin 0) is expressed as P(X=−1|Y∈ bin 0). If the threshold voltage of a cell is in bin 0, the probability P(X=−1, Y∈ bin 0) is high relative to the probability P(X=1|Y∈ bin 0).

These probabilities are computed for each cell, and log-likelihood ratios (LLRs) are calculated from these probabilities. Specifically, when a threshold voltage of a cell lies in one of the bins when Y is known), a LLR can be computed to determine whether the actual threshold voltage (i.e. X) of the cell is 1 or −1. The LLR is expressed as log [P(X=1|Y)/P(X=−1|Y)]. P(X=1|Y) is the probability that the actual threshold voltage X of the cell is 1 given Y (i.e. with the threshold voltage read being in a given bin). P(X=−1|Y) is the probability that the actual threshold voltage X of the cell is −1 given Y (i.e. with the threshold voltage read being in a given bin). The sum of the probabilities P(X=1|Y) and P(X=−1|Y) is 1. That is, P(X=1|Y)+P(X=−1|Y)=1.

The LLR is positive if P(X=1|Y) is greater than P(X=−1|Y), and the LLR is negative if P(X=1|Y) is less than P(X=−1|Y). Accordingly, if the sign of LLR is positive, the actual threshold voltage of the cell is more likely to be 1, and if the sign of LLR is negative, the actual threshold voltage of the cell is more likely to be −1. The absolute value of the magnitude of the LLR indicates confidence in the result. Higher the absolute value of the magnitude, greater the confidence in the result. In other words, the sign of LLR indicates the hard decision, and the absolute value of the magnitude of the LLR indicates the reliability of the hard decision.

Thus, when a single read is performed to read a block of cells, the result is a stream of hard decisions 1's and −1's associated with the cells. On the other hand, when multiple reads are performed, the result is bin numbers associated with the cells. The states of the cells in right-most and left-most bins are 1's and −1's, respective with high reliability. Information about the states of the cells in the right-most and left-most bins is the soft information that can be used by the decoder in determining the states of the remaining cells whose states are uncertain.

The reference voltages for multiple reads can be set as follows. In general, the process of performing t reads can be interpreted as dividing a real line on which the threshold voltages lie into (t+1) regions and binning the threshold voltage of a cell to one of the regions. More generally, this process can be interpreted as a channel with two inputs (−1 and 1) and (t+1) outputs (i.e. the (t+1) regions or bins). For example, as shown in FIG. 5, by performing three reads, the threshold voltage of a cell can be binned into one of the four regions or bins.

Figures 6A, 6B:
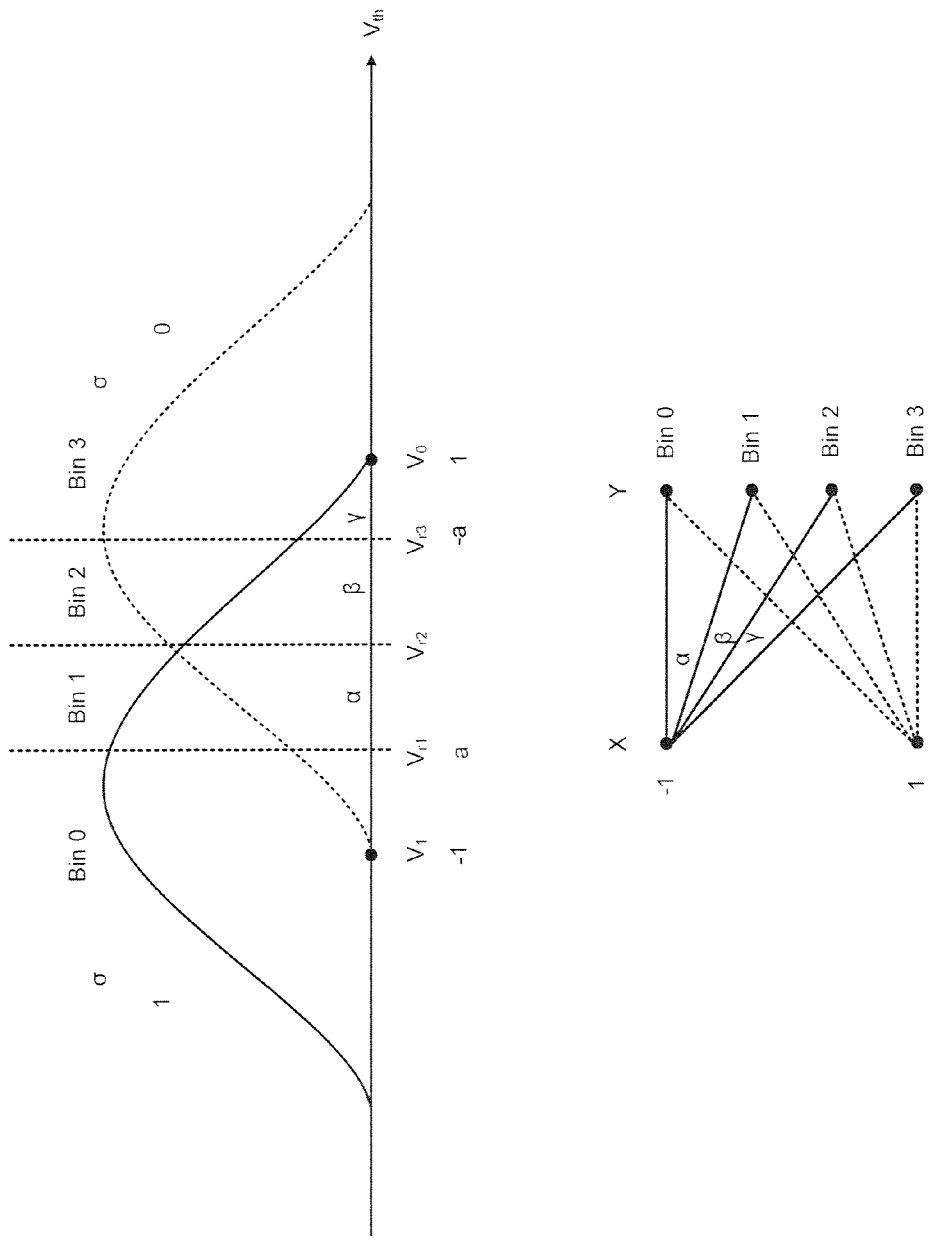
FIG. 6A depicts binning, of a threshold voltage age distribution of a single-bit cell.
FIG. 6B shows a 2-input, 4-output channel for a single-bit cell.

Referring now to FIGS. 6A and 6B, a 2-input, 4-output channel is shown. The two inputs are the nominal threshold voltages of the cells (−1 or 1). The four outputs are the four bins in which the threshold voltages of the memory cells read lie. A cell haying a threshold voltage corresponding to the state −1 may lie in any one of the 4 bins. The probability that the threshold voltage corresponding to the state −1 lies in bin 0 is highest. The threshold voltage corresponding to the state −1, however, may also lie in bins 1 through 3. The probabilities that the threshold voltage corresponding to the state −1 read the cell lies in bins 1, 2, and 3 are α, β, and γ, respectively. Accordingly, the probability that the threshold voltage corresponding to the state −1 lies in bin 0 is (1−(α+β+γ)). Similar analysis obtains for a cell having a threshold voltage corresponding to the state 1.

The probabilities α, β, and γ are functions of the three reference voltages $V_{r1}$, $V_{r2}$, and $V_{r3}$. The probabilities α, β, and γ can be computed based on the variance of the threshold voltage distribution. The reference voltages $V_{r1}$, $V_{r2}$, and $V_{r3}$ can then be selected based on the probabilities α, β, and γ.

According, to information theory, the best values for the reference voltages are those which give a channel having maximum mutual information. Mutual information is a metric which quantifies the amount of information that an output contains about an input. Accordingly, the best values of the references voltages are those which give a channel in which the output contains maximum information about the input.

The concept of mutual information can be understood by considering the following example. Suppose a die is rolled, and the only information available about the output is that the output is even. The information would indicate that the output could be 2, 4, or 6. That is, the information has some uncertainty about the actual value of the output. If, however, additional information about the output is available indicating that the output is also divisible by 4, then there is no uncertainty that the output is 4 since other values (2 and 6) are not divisible by 4. The additional information that the output is even and that the output is divisible by 4 is called mutual information.

In case of memory cells, the threshold voltage of a cell (i.e. X) is estimated by observing the outputs Y (i.e., bins in which the threshold voltage read lies). The best value of the output Y is that which gives maximum mutual information about X so that the estimate of X is most accurate. Mathematically, mutual information of a channel can be computed as follows.

Let X be a discrete random variable with alphabet $\chi$ and probability mass function ion p(x)=Pr{X=x}, x$\in\chi$. An entropy of X is defined by the following equation.

$$H(X) = -\sum_{x \in \chi} p(x) \log(p(x))$$

A joint entropy H(X,Y) of a pair of discrete random variables (X,Y) with a joint distribution p(x,y) is defined by the following equation.

$$H(X, Y) = -\sum_{x \in \chi} \sum_{y \in \phi} p(x, y) \log(p(x, y))$$

The mutual information I(X,Y) of a pair of random variables (X,Y) is given the following equation.

I(X,Y)=H(X)+H(Y)−H(X,Y)=H(X)−H(X|Y)=H(Y)−H(X|Y)

In the mutual information I(X,Y), H(X) is an uncertainty about X (i.e. whether X is −1 or 1). H(X|Y) is an amount of uncertainty about X given Y. If H(X|Y) is 0. Y completely determines X. Conversely, if H(X|Y) is 1, Y tells nothing bout X, and X is totally uncertain. I(X,Y) is, therefore, the reduction of uncertainty in X due to knowledge of Y. Accordingly reference voltages that give maximum information about the actual threshold voltages of the cells should be selected to perform read operations.

Generally, performing t reads gives a channel with 2 inputs and (t+1) outputs. The best set of t reference voltages is the set that gives a channel with the maximum mutual information. Hence the optimal set of reference voltages can be found by considering different settings of the reference voltages, computing the mutual information of the resulting channels, and selecting, the channel pith the maximum mutual information. In general, two additional reads may be performed to generate one extra bit of soft information.

Specifically, for a single read the reference voltage can be set at the center of the threshold voltage distribution from −1 to 1 (i.e. at 0). For example, if threshold voltages $V_1$ and $V_0$ corresponding to states −1 and 1 are 1V and 4V, respectively the reference voltage can be set at 0.5*(1V+4V)=2.5V. For three reads, the three reference voltages can be determined as follows. The range of threshold voltage values between states −1 and 1 can be divided into multiple values. Each value can be considered a candidate for a reference voltage. One of the reference voltages is set at the center of the range (−1, 1) (i.e., at 0). Of the other two reference voltages, one reference voltage is considered to be a value a, which can be varied between −1 and 0, and the other reference voltage can be considered to be −a as shown in FIG. 6A.

Initially, a is set to −1 and varied from −1 to 0 in predetermined increments (e.g. increments of 0.01). For each value of a (e.g. −1, −0.99, . . . , and −0.01), probabilities $\alpha$, $\beta$, and $\gamma$ and the mutual information I(X,Y) are calculated. From the values of the mutual information (in the example, 100 values due to the increment of 0.01), the maximum value of I(X,Y) and the value of a corresponding to the maximum value of I(X,Y) are selected. For example only, the value of a corresponding to the maximum value of I(X,Y) may be −0.3. Since one of the reference voltages is set at the center of the range (−1, 1) (i.e. at 0), due to symmetry around the center, the value of −a automatically becomes 0.3. Thus, the three reference voltages can be selected as −0.3, 0, and 0.3 on the range (−1, 1). The reference voltages for five reads, seven reads, and so on can be similarly determined.

As the number of reads increases, the resources such as memory to store data read in the additional reads, the delay in processing, the data, and the power consumed in performing, the additional read and processing also increase. Hence the maximum number of reads can be limited and preset during manufacture.

As the number of reads increases, the number of calculations to select the additional reference voltages also increases. To limit the complexity, progressive reads can be used, where reference voltages for (t+2) reads are determined from the reference voltages for t reads. Since the reference voltages for the previous t reads are already known and are used when performing, (t+2) reads, only two additional reference voltages need to be determined when performing (t+2) reads. All possible values for the two extra reference voltages can be considered.

The process can be further simplified to calculate only one of the two additional reference voltages when the number of additional reads is incremented by two. The other reference voltage is obtained automatically due to symmetry of the threshold voltage distribution around the center as explained above. For example, when incrementing the number of reads from three to five, only the fourth reference voltage is calculated since the fifth reference voltage can be automatically arrived by changing sign of the fourth reference voltage. Similarly, when incrementing the number of reads from five to seven, only the sixth reference voltage is calculated since the seventh reference voltage can be automatically arrived by changing sign of the sixth reference voltage, and so on.

When calculating the reference voltages the probabilities and the LLRs associated with each bin are also calculated. The LLRs are assigned to respective bins. Like the reference voltages, the LLR values can also be symmetrical around the center of the threshold voltage distribution. For example, the LLR value for bin 0 can be the same as the LLR value for bin 3 except for the change of sign. Similarly, the LLR value for bin 1 can be the same as the LLR value for bin 2 except for the change of sign, and so on.

When the reference voltage is set at the center of the range (−1.1) during 1 hard decision, errors may occur in the hard decision and/or in three or more reads performed utilizing the reference voltage. The errors may occur when the center shifts due to usage and/or noise. For example, the mean values of the threshold voltage distributions corresponding to the states −1 and 1 and/or variances of the threshold voltage distributions may change causing the center to shift from 0.

Accordingly, errors may persist or may not reduce despite increasing the number of reads. Therefore, the cause of errors in the existing number of reads should be determined before increasing the number of reads further (e.g. from three to five). The errors may be caused by a shift in the center or because the existing number of reads is insufficient to reduce the errors.

If the errors occur due to the shift in the center, the amount of shift can be estimated, the three reference voltages can be adjusted based on the amount of shift, and the three or more reads can be retried using the adjusted reference voltages before increasing the number of reads further. Alternatively, instead of adjusting the reference voltages. LLRs can be recalculated to account for the shift and reassigned to the bins, and the three or more reads can be retried using the adjusted reference voltages before increasing the number of reads further. Further, additional reference voltages (e.g. the fourth and fifth reference voltages) can be calculated and can be set asymmetrically on one side of the center instead of on either side of the center) to compensate for the shift.

Referring now to FIG. 7A-7C the shift in the center can be detected and compensated as follows. For example, when the center is estimated correctly, the results of three reads may appear in the form of a histogram shown in FIG. 7A, where the bin counts are symmetric. That is, bin counts of bins 0 and 3 are the same and bin counts of bins 1 and 2 are the same. When the center shifts and the reference voltages are not adjusted for the shift, the errors may become asymmetric around the center. Accordingly, the bin counts will be asymmetric. The bin counts will be asymmetric particularly for bins 1 and 2 as shown in FIG. 7B. The histogram shown FIG. 7B indicates that the errors are due to a shift in the center. It can be shown that the amount of shift in the center can be determined from the histograms.

Subsequently, the center and the reference voltages can be corrected to account for the shift, and the current number of reads can be retried. Alternatively, the LLR assignments of the bins can be changed instead of adjusting or recalculating the reference voltages to account for the shift, and the current number of reads can be retried using the existing reference voltages.

If the errors persist or do not reduce, the number of reads can be increased. When the number of reads is increased after determining that the center has shifted, the additional reference voltages are not set symmetrically around the center. Instead, the additional reference voltages are set asymmetrically relative to the center. For example, both additional reference voltages are set on the same side of the center in a direction opposite to the direction of the shift (see $V_{r4}$ and $V_{r5}$ shown in FIG. 7C).

The optimal reference voltages for progressive reads can be mathematically determined as follows. Initially, the number of additional reads to perform is determined and denoted by a, for example. If the decoding fails for a certain number of reads, a additional reads are performed. The value of a is typically 1 or 2 and can be any positive integer. Given the optimal reference voltages for t reads, the reference voltage for $(t+a)^{th}$ reads is determined by maximizing the mutual information of the 2-input-(t+a)-output channel.

In particular, it can be shown that $$[Vr_{t+1}, \ldots, Vr_{t+a}] = \arg\max_{Vr_{t+1},\ldots,Vr_{t+a}} I(X, Y)$$

where X is the input to the underlying channel. In case of 1-bit/cell. X corresponds to $\{V_0, V_1\}$, and Y denotes a quantized output of the channel depending on the reference voltages $Vr_1, \ldots, Vr_t, Vr_{t+1}, \ldots, Vr_{t+a}$. Specifically, the reference voltages segment a signal space into $(t+a+1)$ regions as shown, where 2 more reference voltages are added onto existing 3 reads. In this case, the mutual information $I(X,Y)$ can be computed by the following set of equations.

$$I(X, Y) = H(Y) - H(X);$$

$$P(y \in Ri) = P(Ri, 0) + P(Ri, 1), \quad i = 0, 1, \ldots 5;$$

$$P(Ri, 0) = P(y \in Ri \mid X = V0) \cdot P(X = V0), \quad i = 0, 1, \ldots 5;$$

$$P(Ri, 1) = P(y \in Ri \mid X = V1) \cdot P(X = V1), \quad i = 0, 1, \ldots 5;$$

$$H(Y) = \sum_{i=0}^{5} P(P(y \in Ri) \cdot \log 2(P(y \in Ri));$$

$$H(Y \mid X) = \sum_{i=0}^{5} (P(Ri, 0)\log 2(P(Ri, 0)) + P(Ri, 1)\log 2(P(Ri, 1))).$$

The computation of $P(y \in Ri|X+V0)$ depends on the noise distribution. Assuming, the noise is Gaussian distributed with zero mean and variance $\sigma^2$ it can be shown that $$P(y \in Ri \mid X = V0) = \int_{Ri} \left( \frac{1}{\sqrt{2\pi}\,\sigma} \exp\left(-\frac{(z - V0)^2}{2\sigma^2}\right) \right) dz.$$

Similarly, it can be shown that $$P(y \in Ri \mid X = V1) = \int_{Ri} \left( \frac{1}{\sqrt{2\pi}\,\sigma} \exp\left(-\frac{(z - V1)^2}{2\sigma^2}\right) \right) dz.$$

The equation $$[Vr_{t+1}, \ldots, Vr_{t+a}] = \arg\max_{Vr_{t+1},\ldots,Vr_{t+a}} I(X, Y)$$

can be maximized numerically. After computing, the optimal reference voltages for progressive reads and the corresponding LLRs, the values of the reference voltages and LLRs can be stored in a lookup table and utilized during retry. If the amount of shift in the center and the noise variance are known, optimal LLRs can be calculated and assigned to the bins, and the decoding can be retried using the existing number of reads based on the optimal LLRs. Additional reads may be performed if decoding fails after the retry.

Figure 8:
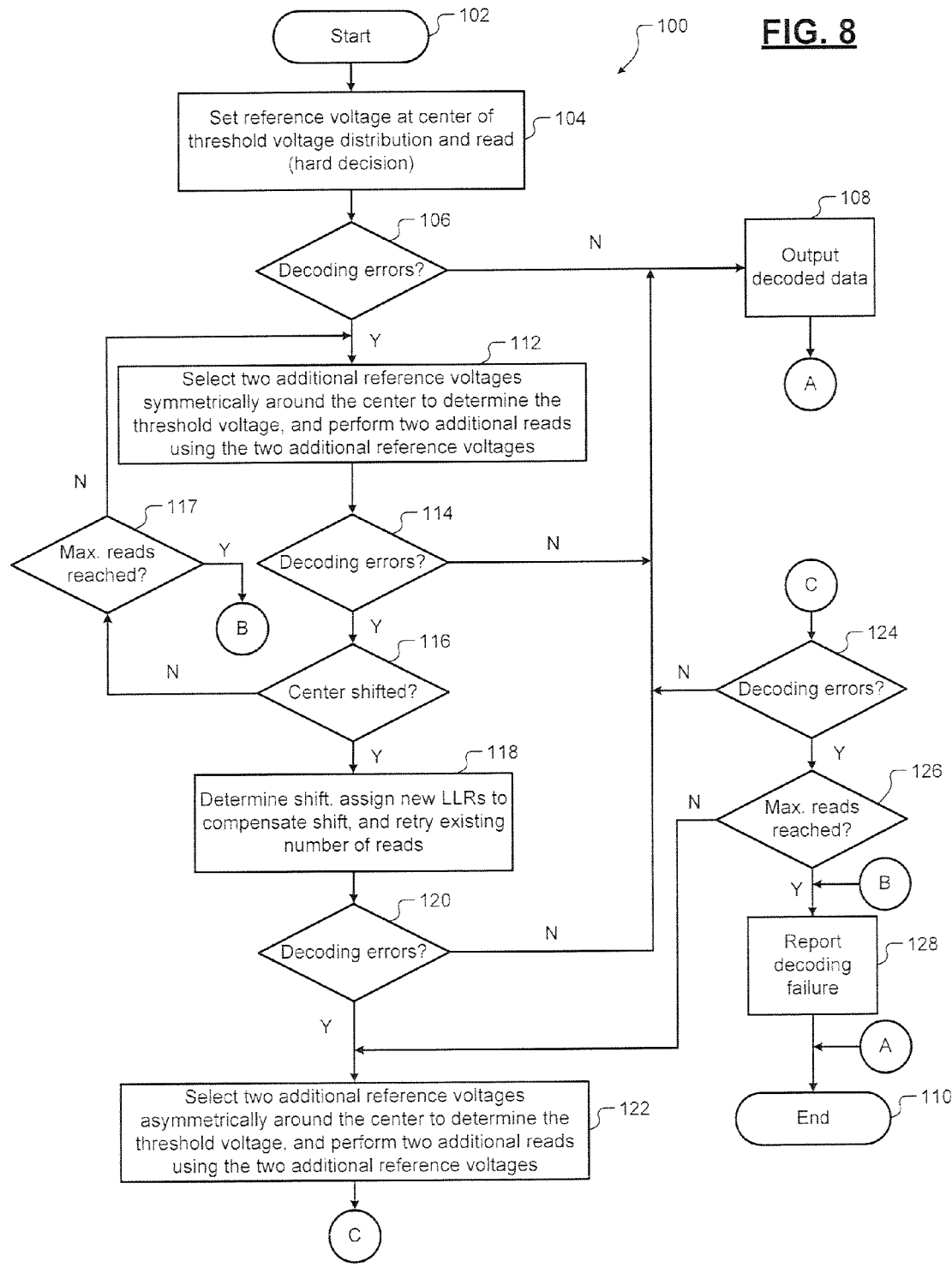
FIG. 8 is a flowchart of a method for determining reference voltages used to perform multiple read operations to estimate threshold voltages of memory cells.

Referring now to FIG. 8, a method 100 for determining, optimal reference voltages for progressive reads is shown. Control begins at 102. At 104, control sets the reference voltage for determining a threshold voltage of a cell or a group of cells at the center of the voltage distribution of the threshold voltage and performs a read (i.e. a hard decision). At 106, control determines if the data read from the cells is decoded correctly based on the hard decision. At 108, the data is output if the data is decoded correctly based on the hard decision, and control ends at 110.

At 112, if the data read from the cells is not decoded correctly based on the hard decision, control selects two additional reference voltages reads to determine the threshold voltage by performing two additional reads (e.g. a total of 3 reads). Control selects the two additional reference voltages symmetrically around the center of the voltage distribution of the threshold voltage. At 114, control determines if the data read from the cells is decoded correctly based on the two additional reads. At 108, the data is output if the data is decoded correctly based on the two additional reads, and control ends at 110.

At 116, if the data read from the cells is not decoded correctly based on the two additional reads, control determines if the center of the voltage distribution of the threshold voltage has shifted. At 117, if the center has not shifted (e.g., if the center has shifted by an amount less than or equal to a predetermined threshold), control determines if a maximum number of read operations allowed is reached. If the maxis number of reads is not yet reached, control returns to 112. If the maximum number of reads is reached, control reports a decoding failure at 128 and control ends at 110.

At 118, if the center has shifted (e.g., if the center has shifted by an amount greater than or equal to a predetermined threshold), control determines the amount of shift, calculates new LLRs based on the amount of shift, and retries the existing number of reads using the new LLR values assigned to the bins. For example, as explained above, new probabilities $\alpha$, $\beta$, and $\gamma$ can be computed based on changes in variance of the threshold voltage distribution due to the shift, and new LLRs can be calculated from the new probabilities $\alpha$, $\beta$, and $\gamma$. At 120, control determines if the data read from the cells is decoded correctly based on the retried reads. At 108, the data is output if decoded correctly based on the retried reads, and control ends at 110.

At 122, if the data read from the cells is not decoded correctly based on the retried reads, control selects two additional reference voltages to determine the threshold voltage by performing two additional reads (e.g. a total of 5 reads). Control selects the two additional reference voltages asymmetrically around the center of the voltage distribution of the threshold voltage to account for the shift. At 124 control determines if the data read from the cells is decoded correctly based on the additional reads. At 108, the data is output if the data is decoded correctly based on the additional reads, and control ends at 110.

At 126, if the data read from the cells is not decoded correctly based on the additional reads, control determines if the maximum number of read operations allowed is reached. If the maximum number of reads is not yet reached, control returns to 122. If the maximum number of reads is reached, control reports a decoding failure at 128, and control ends at 110.

Figure 3A:
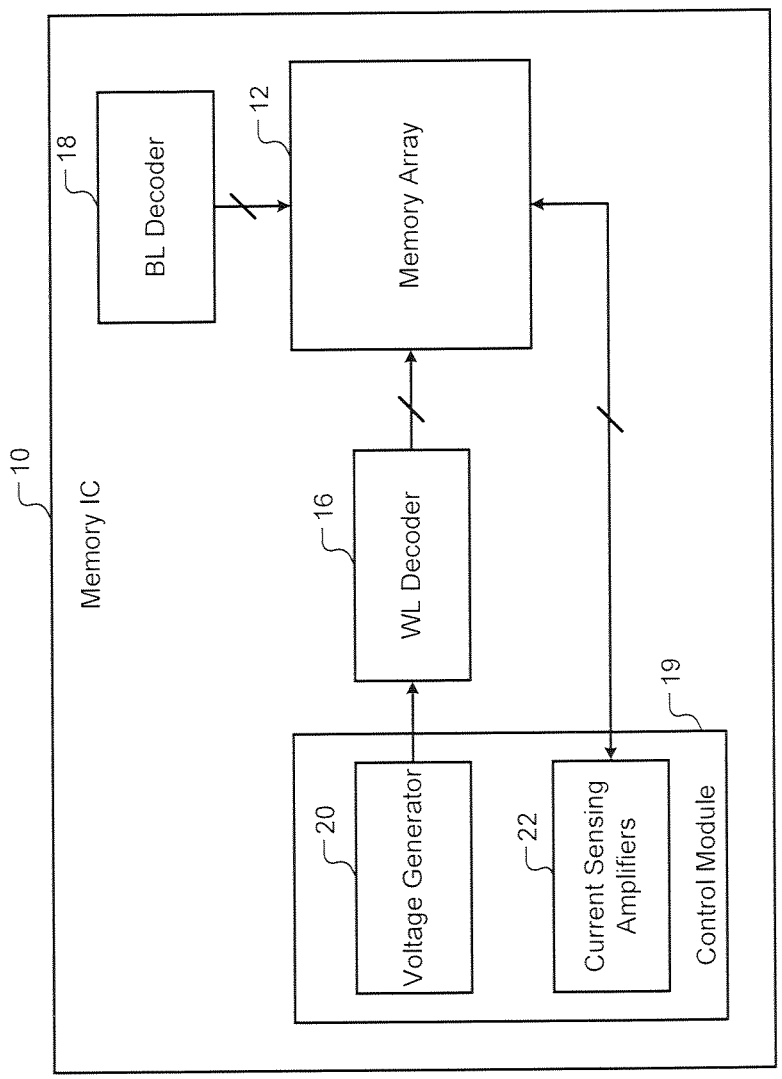
FIGS. 3A and 3B are functional block diagrams of the memory IC of FIG. 1.
Figure 3B:
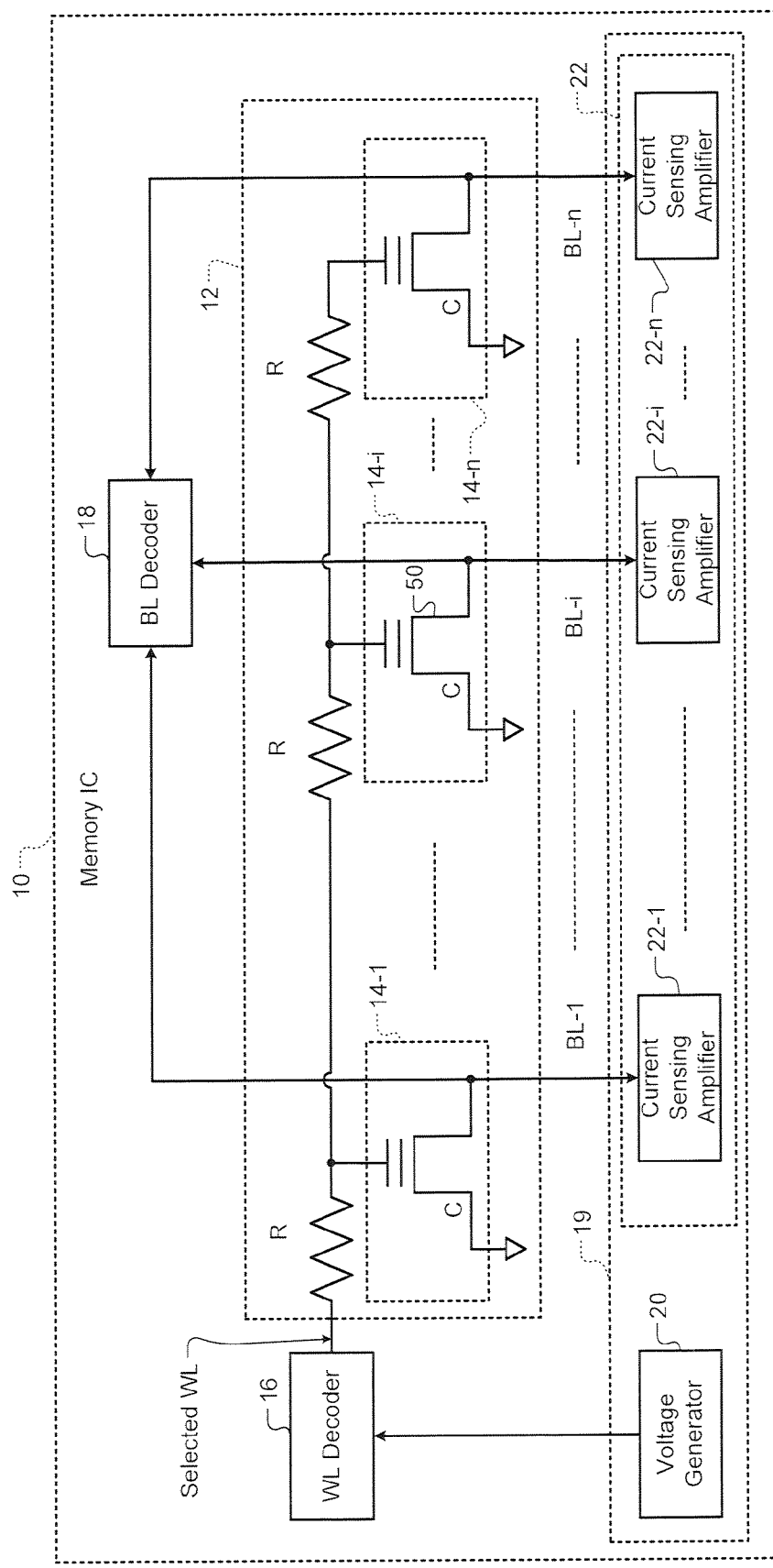
Figure 9A:
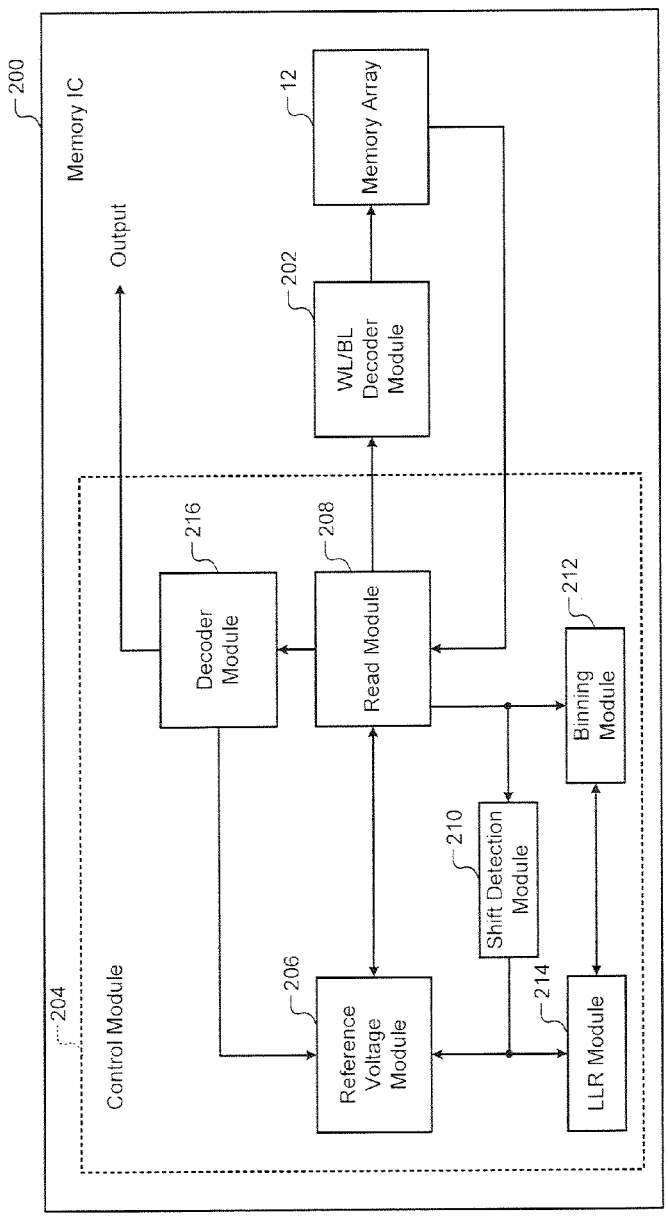
FIGS. 9A and 9B are functional block diagrams of a system for determining reference voltages used to perform multiple read operations to estimate threshold voltages of memory cells.
Figure 9B:
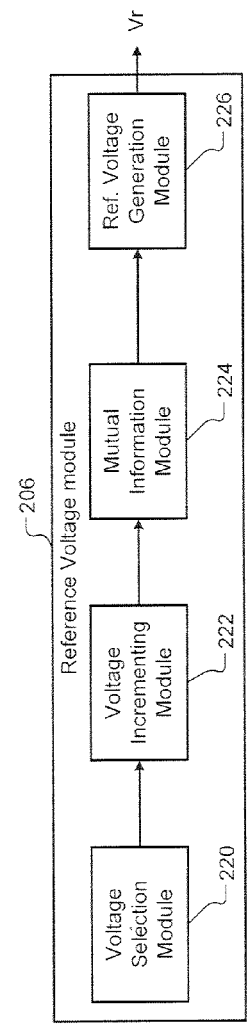

Referring to FIGS. 9A and 9B, a system for determining optimal reference voltages for progressive reads is shown. In FIG. 9A, the system is implemented in a memory integrated circuit (IC) 200 for example. The memory IC 200 comprises the memory 12 (also shown in FIG. 3A), a word-line/bit-line (WL/BL) decoder module 202, and a control module 204. The WL/BL decoder module 202 includes the WL decoder 16 and the BL decoder 18 shown in FIG. 3A.

The control module 204 comprises a reference voltage module 206, a read module 208, a shift detection module 210, a binning module 212, a log-likelihood ratio (LLR) module 214, and a decoder module 216. The read module 208 receives read commands (e.g. from a host (not shown)) and selects one or more blocks/pages of memory cells to read in the memory array 12 according, to the read commands. The WL/BL decoder module 202 addresses the selected memory cells in the memory array 12. The read module 208 comprises circuits that generate voltages that are applied to the selected memory cells. The read module 208 also comprises circuits that sense drain currents through the selected memory cells.

The reference voltage module 206 selects a first reference voltage between a first threshold voltage corresponding, to a first state of a selected memory cell and a second threshold voltage corresponding to a second state of the selected memory cell. For example, as shown in FIG. 5, the reference voltage module 206 selects $V_{r2}$ between $V_1$ and $V_0$. The reference voltage module 206 selects a second reference voltage (e.g. $V_{r1}$ shown in FIG. 5) that is less the first reference voltage and selects a third reference voltage (e.g. $V_{r3}$ shown in FIG. 5) that is greater than the first reference voltage.

The read module 208 performs a first read operation (i.e. a hard decision) to determine a state of the selected memory cell (or the states of the selected memory cells in a page) based on the first reference voltage. The decoder module 216 decodes data read from the memory cells in the first read operation based on the hard decisions.

If, based on the hard decisions, the decoder module 216 fails to decode the data or detects decoding errors greater than a predetermined error threshold, the read module 208 performs second and third read operations to determine the states of the selected memory cells based on the second and third reference voltages, respectively. The decoder module 216 decodes data read from the memory cells in the first, second, and third read operations.

If the decoder module 216 still fails to decode data read in the three reads, the shift detection module 210 determines if the center of the threshold voltage distribution has shifted. If the center of the threshold voltage distribution has shifted, the shift detection module 210 determines the amount of shift. The shift detection module 210 may also determine whether the amount of shift is less than or equal to a predetermined threshold or whether the amount of shift is greater than or equal to a predetermined threshold. In some implementations, the shift detection module 210 may use two different thresholds.

If the amount of shift is less than or equal to a predetermined threshold, the reference voltage module 206 selects a fourth reference voltage that is different than the first/second/third reference voltages, and selects a fifth reference voltage that is different than the first/second/third/fourth reference voltages. The reference voltage module 206 selects the fourth and fifth reference voltages symmetrically around the center of the threshold voltage distribution. The read module 208 performs fourth and fifth read operations to determine the states of the memory cells based on the fourth and fifth reference voltages, respectively. The decoder module 216 decodes data read from the memory cells in the first through fifth read operations. If the amount of shift is less than the predetermined threshold, only decoding is retried using adjusted LLRs without performing additional read operations.

If the decoder module 216 still fails to decode data correctly and if a maximum number of reads is not yet reached, the reference voltage module 206 increases the number of read operations by to more reads, selects two additional reference voltages, and so on. If decoding errors persist when the maximum number of reads is reached, the decoder module 216 declares a decoding failure.

If the amount of shift is greater than or equal to a predetermined threshold, one of two approaches may be used. In a first approach, the reference voltage module adjusts the first, second, and third reference voltages based on the amount of shift. The read module 208 retries the first, second, and third read operations based on the adjusted first, second, and third reference voltages, respectively. The decoder module 216 decodes data read from the memory cells in the retried first, second and third read operations.

If the decoder module 216 still fails to decode data correctly and if a maximum number of reads is not yet reached, the reference voltage module 206 increases the number of read operations by more reads, selects two additional reference voltages taking into account the amount of shift, and so on. If decoding errors persist when the maximum number of reads is reached, the decoder module 216 declares a decoding, failure.

In a second approach, the reference voltage module 206 does not adjust the first, second, and third reference voltages based on the amount of shift. Instead, new LLRs are computed to account for the shift as follows. Specifically, the binning module 212 divides the distribution of the first and second threshold voltages into four bins based on the first, second, and third reference voltages. The LLR module 214 generates LLRs for the four bins based on a variance of the distribution, where a LLR for a bin indicates a likelihood ratio, for the cells with an actual threshold in the bin, between being, in the first state and the second state. The LLR module 214 adjusts the LLRs based on the amount of shift and assigns the adjusted LLRs to the four bins. The read module 208 retries the first, second, and third read operations based on the adjusted LLRs using the first, second, and third reference voltages, respectively. The decoder module 216 decodes data read the memory cells in the retried first, second, and third reads.

If the decoder module 216 still fails to decode data correctly, the reference voltage module 206 increases the number of read operations by two more reads, selects two additional reference voltages by taking into account the amount of shift. Specifically, the reference voltage module 206 selects fourth and fifth reference voltages that are asymmetric around the center of the threshold voltage distribution. For example, as shown in FIG. 7C, unlike $V_{r1}$ and $V_{r3}$, which are symmetric around the center ($V_{r2}$), the fourth and fifth reference voltages ($V_{r4}$ and $V_{r5}$) can be on the same side of the center ($V_{r2}$) instead of being symmetric around the center. That is, the reference voltage nodule 206 selects $V_{r4}$ and $V_{r5}$ in a direction (to the left) opposite to the direction in which the center of the voltage distribution has shifted (to the right). As a result, a first difference between the fourth reference voltage and the first reference voltage is not equal to a second difference between the fifth reference voltage and the first reference voltage. Such a selection compensates for the shift.

The read module 208 performs fourth and fifth read operations to determine the states of the memory cells based on the fourth and fifth reference voltages, respectively. The decoder module 216 decodes data read from the memory cells in the retried first through fifth read operations. If the decoder module 216 still fails to decode data correctly and if a maximum number of reads is not yet reached, the reference voltage module 206 increases the number of read operations by two more reads, selects two additional reference voltages by taking the shill into account, and so on. If decoding errors persist when the maximum number of reads is reached, the decoder module 216 declares a decoding failure.

In FIG. 9B, the reference voltage module 206 calculates the reference voltages as follow. The reference voltage module 206 comprises a voltage selection module 220, a voltage incrementing module 222, a mutual information module 224, and a reference voltage generation module 226. The reference voltage module 206 sets the first reference voltage (e.g. $V_{r2}$ shown in FIG. 5) at the center of the threshold voltage distribution a midpoint of the first and second threshold voltages ($V_1$ and $V_0$)).

To determine the second and third reference voltages, the voltage selection module 220 selects a first voltage adjacent to the first threshold voltage ($V_1$). For example, the voltage selection module 220 selects the first voltage at a distance a from the center of the threshold voltage distribution on a line comprising the threshold voltage distribution. The voltage incrementing module 222 increments the first voltage in fixed increments i.e. by a predetermined amount) until the first voltage increases to the midpoint of the first and second threshold voltages ($V_1$ and $V_0$).

At each increment, the mutual information module 224 generates mutual information for each incremented value of the first voltage as explained in the discussion above. The mutual information is a parameter that indicates a statistical certainty to which each incremented value of the first voltage represents an actual threshold voltage of the memory cell. The reference voltage module 206 selects one of the incremented values of the first voltage having a highest value of the statistical certainty as the second reference voltage (e.g., $V_{r1}$ shown in FIG. 5). Due to symmetry around the center of the threshold voltage distribution, the reference voltage module 206 selects the third reference voltage (e.g. $V_{r3}$ shown in FIG. 5) by adding a difference between the first and second reference voltages to the first reference voltage. The reference voltage module 206 similarly selects the fourth, fifth and any additional reference voltages.

The broad teachings of the disclosure can be implemented in a variety of forms. Therefore, while this disclosure includes particular examples the true scope of the disclosure should not be so limited since other modifications will become apparent upon a study of the drawings, the specification, and the following claims.

What is claimed is:

1. A system comprising:
   a reference voltage module configured to
      select a first reference voltage between a first threshold voltage corresponding to a first state of a memory cell and a second threshold voltage corresponding to a second state of the memory cell, wherein the first state and the second state are consecutive states of the memory cell, and wherein the first threshold voltage is less than the second threshold voltage, and
      select a second reference voltage, wherein the second reference voltage is less than the first reference voltage and greater than the first threshold voltage, and
      select a third reference voltage, wherein the third reference voltage is greater than the first reference voltage and less than the second threshold voltage; and
   a read module configured to
      perform a first read operation to determine a state of the memory cell based on the first reference voltage, and
      in response to a first failure to decode data read from the memory cell in the first read operation, perform a second read operation to determine the state of the memory cell based on the second reference voltage, and perform a third read operation to determine the state of the memory cell based on the third reference voltage.

2. The system of claim 1, further comprising a shift detection module configured to:
   detect, in response to a second failure to decode data read from the memory cell in the first, second, and third read operations, a shift in a distribution of at least one of the first threshold voltage and the second threshold voltage, and
   determine an amount of the shift.

3. The system of claim 2, wherein:
   the reference voltage module is configured to adjust the first, second, and third reference voltages based on the amount of shift in response to the amount of shift being greater than or equal to a predetermined threshold; and
   the read module is configured to retry the first, second, and third read operations based on the adjusted first, second, and third reference voltages, respectively.

4. The system of claim 2, further comprising:
a binning module configured to divide the distribution of the first and second threshold voltages into four bins based on the first, second, and third reference voltages; and
a log-likelihood ratio module configured to generate log-likelihood ratios for the four bins based on a variance of the distribution.

5. The system of claim 4, wherein:
the log-likelihood ratio module is configured to adjust the log-likelihood ratios based on the amount of shift, and
wherein the read module is configured to retry the first, second, and third read operations based on the adjusted log likelihood ratios and the first, second, and third reference voltages, respectively.

6. The system of claim 4, wherein the log-likelihood ratio module is configured to adjust the log-likelihood ratios based on the amount of shift, the system further comprising:
a decoder module configured to
decode data read from the memory cell in the first read operation, and
in response to (i) the first failure to decode data read from the memory cell in the first read operation and (ii) the amount of shift being less than a predetermined threshold, decode data read from the memory cell using the adjusted log likelihood ratios instead of performing additional read operations.

7. The system of claim 2, wherein in response to the amount of shift being less than or equal to a predetermined threshold:
the reference voltage module is configured to
select a fourth reference voltage, wherein the fourth reference voltage is different than the first, second, and third reference voltages, and
select a fifth reference voltage, wherein the fifth reference voltage is different than the first, second, third, and fourth reference voltages; and
the read module is configured to perform fourth and fifth read operations to determine the state of the memory cell based on the fourth and fifth reference voltages, respectively.

8. The system of claim 5, wherein in response to a third failure to decode data read from the memory cell after the retried first, second, and third read operations:
the reference voltage module is configured to select a fourth reference voltage and a fifth reference voltage, wherein a first difference between the fourth reference voltage and the first reference voltage is not equal to a second difference between the fifth reference voltage and the first reference voltage; and
the read module is configured to perform fourth and fifth read operations to determine the state of the memory cell based on the fourth and fifth reference voltages, respectively.

9. The system of claim 1, further comprising:
a voltage selection module configured to select a first voltage adjacent to the first threshold voltage;
a voltage incrementing module configured to increment the first voltage by a predetermined amount until the first voltage increases to a midpoint of the first and second threshold voltages; and
a parameter generation module configured to generate a parameter for each incremented value of the first voltage, wherein the parameter for an incremented value of the first voltage indicates a statistical certainty regarding an actual state of the memory cell, and
wherein the reference voltage module selects one of the incremented values of the first voltage having a highest value of the statistical certainty as the second reference voltage.

10. The system of claim 8, wherein the reference voltage module selects the third reference voltage by adding a difference between the first and second reference voltages to the first reference voltage.

11. The system of claim 1, further comprising a decoder module configured to:
decode data read from the memory cell in the first read operation, and
in response to the first failure to decode data read from the memory cell in the first read operation, decode data read from the memory cell in the first, second, and third read operations.

12. A method comprising:
selecting a first reference voltage between a first threshold voltage corresponding to a first state of a memory cell and a second threshold voltage corresponding to a second state of the memory cell, wherein the first state and the second state are consecutive states of the memory cell, and wherein the first threshold voltage is less than the second threshold voltage;
selecting a second reference voltage, wherein the second reference voltage is less than the first reference voltage and greater than the first threshold voltage;
selecting a third reference voltage, wherein the third reference voltage is greater than the first reference voltage and less than the second threshold voltage;
performing a first read operation to determine a state of the memory cell based on the first reference voltage;
in response to a first failure to decode data read from the memory cell in the first read operation, performing a second read operation to determine the state of the memory cell based on the second reference voltage; and
performing a third read operation to determine the state of the memory cell based on the third reference voltage.

13. The method of claim 12, further comprising:
detecting, in response to a second failure to decode data read from the memory cell in the first, second, and third read operations, a shift in a distribution of at least one of the first threshold voltage and the second threshold voltage; and
determining an amount of the shift.

14. The method of claim 13, further comprising:
adjusting the first, second, and third reference voltages based on the amount of shift in response to the amount of shift being greater than or equal to a predetermined threshold; and
retrying the first, second, and third read operations based on the adjusted first, second, and third reference voltages, respectively.

15. The method of claim 13, further comprising:
dividing the distribution of the first and second threshold voltages into four bins based on the first, second, and third reference voltages; and
generating log-likelihood ratios for the four bins based on a variance of the distribution.

16. The method of claim 15, further comprising:
adjusting the log-likelihood ratios based on the amount of shift; and
retrying the first, second, and third read operations based on the adjusted log likelihood ratios and the first, second, and third reference voltages, respectively.

17. The method of claim 15, further comprising:

adjusting the log-likelihood ratios based on the amount of shift;

decoding data read from the memory cell in the first read operation; and in response to (i) the first failure to decode data read from the memory cell in the first read operation and (ii) the amount of shift being less than a predetermined threshold, decoding data read from the memory cell using the adjusted log likelihood ratios instead of performing additional read operations.

18. The method of claim 13, further comprising, in response to the amount of shift being less than or equal to a predetermined threshold:

selecting a fourth reference voltage, wherein the fourth reference voltage is different from the first, second, and third reference voltages;

selecting a fifth reference voltage, wherein the fifth reference voltage is different from the first, second, third, and fourth reference voltages; and performing fourth and fifth read operations to determine the state of the memory cell based on the fourth and fifth reference voltages, respectively.

19. The method of claim 16, further comprising, in response to a third failure to decode data read from the memory cell after the retried first, second, and third read operations:

selecting a fourth reference voltage and a fifth reference voltage, wherein a first difference between the fourth reference voltage and the first reference voltage is not equal to a second difference between the fifth reference voltage and the first reference voltage; and performing fourth and fifth read operations to determine the state of the memory cell based on the fourth and fifth reference voltages, respectively.

20. The method of claim 12, further comprising:

selecting a first voltage adjacent to the first threshold voltage;

incrementing the first voltage by a predetermined amount until the first voltage increases to a midpoint of the first and second threshold voltages;

generating a parameter for each incremented value of the first voltage, wherein the parameter for an incremented value of the first voltage indicates a statistical certainty regarding an actual state of the memory cell; and selecting one of the incremented values of the first voltage having a highest value of the statistical certainty as the second reference voltage.

* * * * *